US012235551B2

(12) United States Patent
Jia et al.

(10) Patent No.: US 12,235,551 B2
(45) Date of Patent: Feb. 25, 2025

(54) ARRAY SUBSTRATE AND DISPLAY APPARATUS COMPRISING CONNECTION STRUCTURE BETWEEN PIXEL ELECTRODE AND SOURCE ELECTRODE

(71) Applicants: Beijing BOE Display Technology Co., Ltd., Beijing (CN); BOE Technology Group Co., Ltd., Beijing (CN)

(72) Inventors: Yihe Jia, Beijing (CN); Xiangqian Ding, Beijing (CN); Yongzhi Song, Beijing (CN); Xiaoxiang Zhang, Beijing (CN); Xiaolong Li, Beijing (CN); Lianjie Yang, Beijing (CN); Yan Pang, Beijing (CN); Jing Liu, Beijing (CN); Jiantao Liu, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 585 days.

(21) Appl. No.: 17/428,622

(22) PCT Filed: Oct. 23, 2020

(86) PCT No.: PCT/CN2020/123301
§ 371 (c)(1),
(2) Date: Aug. 4, 2021

(87) PCT Pub. No.: WO2022/082747
PCT Pub. Date: Apr. 28, 2022

(65) Prior Publication Data
US 2022/0317524 A1    Oct. 6, 2022

(51) Int. Cl.
*G02F 1/1362*    (2006.01)
*G02F 1/1343*    (2006.01)
(Continued)

(52) U.S. Cl.
CPC .... *G02F 1/136227* (2013.01); *G02F 1/13439* (2013.01); *H01L 27/1248* (2013.01);
(Continued)

(58) Field of Classification Search
None
See application file for complete search history.

(56) References Cited

U.S. PATENT DOCUMENTS

| 2013/0015459 | A1* | 1/2013 | Lee | H01L 27/127 |
| | | | | 257/E21.409 |
| 2013/0299830 | A1* | 11/2013 | Ishigaki | H01L 27/1259 |
| | | | | 257/59 |
| 2019/0311943 | A1* | 10/2019 | Wan | H01L 27/1262 |

FOREIGN PATENT DOCUMENTS

| CN | 104867878 A | 8/2015 |
| CN | 105742292 A | 7/2016 |

(Continued)

*Primary Examiner* — Daniel Whalen
(74) *Attorney, Agent, or Firm* — Ling Wu; Stephen Yang; Ling and Yang Intellectual Property

(57) ABSTRACT

The present disclosure provides an array substrate, a method for manufacturing the array substrate, and a display apparatus. The array substrate includes: a base substrate, a thin film transistor disposed on the base substrate; a first passivation layer, an organic film layer and a pixel electrode disposed on the thin film transistor; a connection structure for connecting the source electrode of the thin film transistor and the pixel electrode, wherein the connection structure is disposed in a via hole structure exposing the pixel electrode and the source electrode; or, the connection structure is disposed between the pixel electrode and the source electrode.

9 Claims, 8 Drawing Sheets

(51) Int. Cl.
*H01L 27/12* (2006.01)
*G02F 1/1368* (2006.01)

(52) U.S. Cl.
CPC .... *H01L 27/1288* (2013.01); *G02F 1/134363* (2013.01); *G02F 1/1368* (2013.01)

(56) References Cited

FOREIGN PATENT DOCUMENTS

| | | |
|---|---|---|
| CN | 107068612 A | 8/2017 |
| CN | 107507850 A | 12/2017 |
| EP | 1601031 A1 | 11/2005 |

* cited by examiner

ARRAY SUBSTRATE AND DISPLAY APPARATUS COMPRISING CONNECTION STRUCTURE BETWEEN PIXEL ELECTRODE AND SOURCE ELECTRODE

CROSS-REFERENCE TO RELATED APPLICATION

The present disclosure is a U.S. National Phase Entry of International Application PCT/CN2020/123301 having an international filing date of Oct. 23, 2020, and the contents disclosed in the above-mentioned application are hereby incorporated as a part of this application.

TECHNICAL FIELD

Embodiments of the present disclosure relate to, but are not limited to, the field of display technology, in particular to an array substrate and a method for manufacturing the array substrate, and a display apparatus.

BACKGROUND

Liquid Crystal Display (LCD) has advantages such as small size, low power consumption and no radiation, and has developed rapidly in recent years. A liquid crystal display panel includes a Thin Film Transistor (TFT) array substrate with cell and a Color Filter (CF) substrate, and Liquid Crystal (LC) molecules are disposed between the array substrate and the color filter substrate. By controlling a common electrode and a pixel electrode, an electric field is formed to drive liquid crystal deflection, thus gray scale display is achieved.

According to a research by the inventor of the present disclosure, some array substrates are prone to the problem that the pixel electrode and the source electrode cannot be effectively connected.

SUMMARY

The following is a summary of subject matter described in detail herein. This summary is not intended to limit the protection scope of the claims.

In one aspect, an embodiment of the present disclosure provides an array substrate, including:
  a base substrate;
  a thin film transistor disposed on the base substrate;
  a first passivation layer, an organic film layer and a pixel electrode disposed on the thin film transistor;
  a connection structure configured to connect the source electrode of the thin film transistor and the pixel electrode, wherein the connection structure is disposed in a via hole structure exposing the pixel electrode and the source electrode; or, the connection structure is disposed between the pixel electrode and the source electrode.

In another aspect, an embodiment of the present disclosure further provides a display apparatus including the array substrate of the aforementioned embodiments.

In another aspect, an embodiment of the present disclosure further provides a method for manufacturing an array substrate, including:
  forming a base substrate, and forming a thin film transistor on the base substrate;
  forming a first passivation layer, an organic film layer and a pixel electrode disposed on the thin film transistor, forming a via hole structure exposing the pixel electrode and the source electrode of the thin film transistor, and forming a connection structure configured to connect the source electrode and the pixel electrode in the via hole structure exposing the pixel electrode and the source electrode of the thin film transistor; or, forming a first passivation layer, an organic film layer and a pixel electrode on the thin film transistor, and forming a connection structure configured to connect the source electrode and the pixel electrode between the pixel electrode and the source electrode; or, forming a first passivation layer, an organic film layer and a pixel electrode disposed on the thin film transistor, and forming a via hole structure exposing the source electrode, wherein the pixel electrode is connected to the source electrode through the via hole structure exposing the source electrode.

Of course, it is not necessary to achieve all of the advantages mentioned above to implement any one product or method of the present disclosure. Other features and advantages of the present disclosure will be set forth in the following embodiments of the specification, or be learned by the implementations of the present disclosure. Purposes and other advantages of the technical solutions of the present disclosure may be achieved and acquired by structures specified in the detailed description, claims and drawings.

Other aspects will become apparent upon reading and understanding accompanying drawings and the detailed description.

BRIEF DESCRIPTION OF DRAWINGS

Accompanying drawings are used to provide a further understanding of technical solutions of the present disclosure and constitute a part of the specification to explain the technical solutions of the present disclosure together with embodiments of the present disclosure, and do not constitute any limitation on the technical solutions of the present disclosure. Shapes and sizes of various components in the drawings do not reflect true scales and are intended to schematically illustrate contents of the present disclosure only.

DESCRIPTION OF REFERENCE SIGNS IN THE DRAWING

Figure 1A:
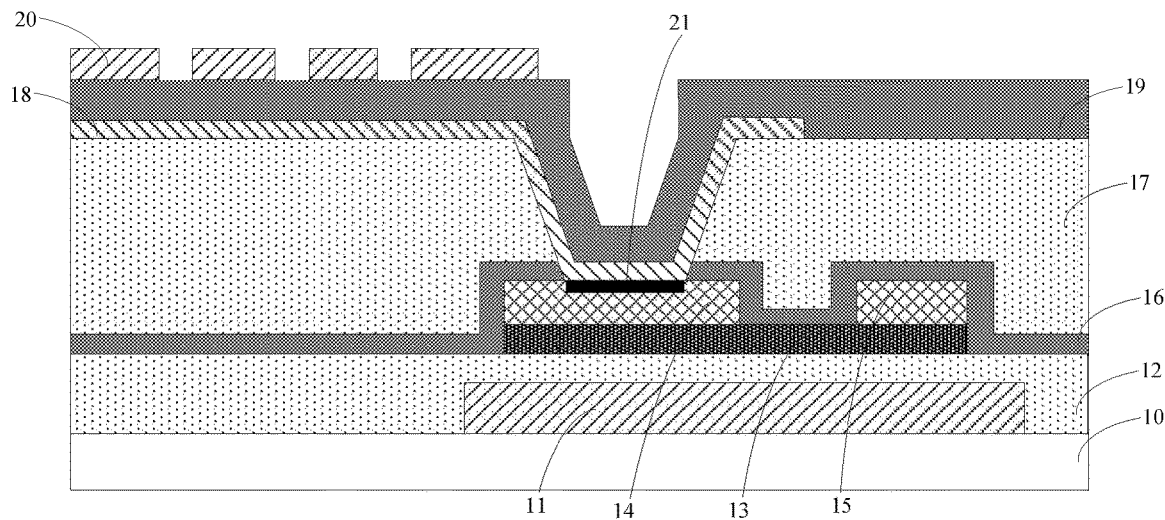
FIG. 1A is a schematic diagram of a structure of an array substrate in some technologies.

| | | |
|---|---|---|
| 10—Base Substrate; | 11—Gate Electrode; | 12—Gate Insulator layer; |
| 13—Active Layer; | 14—Source Electrode; | 15—Drain Electrode; |
| 16—First Passivation Layer; | 17—Organic Film Layer; | 18—Pixel Electrode; |
| 19—Second Passivation layer; | 20—Common Electrode; | 21—Corrosion layer; |
| 22—Connection Structure. | | |

DETAILED DESCRIPTION

Multiple embodiments are described in the present disclosure, but the description is exemplary rather than restrictive, and there may be more embodiments and implementation solutions within the scope of the embodiments described in the present disclosure. Although many possible combinations of features are shown in the drawings and discussed in the Detailed Description, many other combinations of the disclosed features are also possible. Unless specifically limited, any feature or element of any embodiment may be used in combination with or in place of any other feature or element of any other embodiment.

When describing representative embodiments, the specification may have presented methods and/or processes as a specific order of steps. However, to the extent that the method or process does not depend on the specific order of steps described herein, the method or process should not be limited to the specific order of steps described. As those of ordinary skills in the art will understand, other orders of steps are also possible. Therefore, the specific order of steps set forth in the specification should not be interpreted as limiting the claims. In addition, the claims for the method and/or process should not be limited to performing their steps in the written order, and those of skilled in the art may readily understand that these orders may vary and still remain within the essence and scope of the embodiments of the present disclosure.

Unless otherwise defined, technical terms or scientific terms used in the embodiments shall have common meanings as construed by those of ordinary skills in the art to which the present disclosure pertains. The wordings "first", "second" and the like used in the embodiments of the present disclosure do not represent any order, quantity or importance, but are merely used to distinguish among different components. Similar wordings such as "including" or "containing" mean that elements or articles appearing before the word cover elements or articles listed after the word and their equivalents, without excluding other elements or articles. Similar words such as "connect" or "link" are not limited to physical or mechanical connections, but may include electrical connections, whether direct or indirect.

In the present disclosure, a transistor refers to an element that includes at least three terminals: a gate electrode, a drain electrode, and a source electrode. The transistor has a channel region between the drain electrode (or referred to as a drain electrode terminal, a drain region or a drain electrode) and the source electrode (or referred to as a source electrode terminal, a source region or a source electrode), and a current can flow through the drain in electrode, the channel region and the source electrode. In this disclosure, the channel region refers to a region through which a current mainly flows.

In this disclosure, in a case where transistors with opposite polarities are used or a current direction is changed during operation of a circuit, a function of the "source electrode" and a function of the "drain electrode" are sometimes interchangeable. Therefore, the "source electrode" and the "drain electrode" are interchangeable in this disclosure.

In the present disclosure, an "electrical connection" includes a case where constituent elements are connected via an element having a certain electrical action. The "element with a certain electric action" is not particularly limited as long as it can transmit and receive electrical signals between the connected constituent elements. An "element with a certain electrical action" may be, for example, an electrode or wiring, a switching element such as a transistor, or other functional elements such as a resistor, an inductor or a capacitor, etc.

A "patterning process" mentioned in the embodiments of the present disclosure includes processes such as deposition of a film layer, coating of a photoresist, mask exposure, development, etching, and stripping of photoresist, and are mature manufacturing processes in the art. Deposition may adopt a known process such as sputtering, vapor deposition, and chemical vapor deposition. Deposition may be performed by using a known process such as sputtering, evaporation, chemical vapor deposition, or the like, coating may be performed by using a known coating process, and etching may be performed by using a known method, which is not limited here. In the description of the embodiments of the present disclosure, it should be understood that a "thin film" refers to a layer of thin film made of a certain material by using deposition or another process on the base substrate. If the "thin film" does not need a patterning process during the whole manufacturing process, the "thin film" may also be called a "layer". If the "thin film" further needs a patterning process during the whole manufacturing process, it is called a "thin film" before the patterning process and a "layer" after the patterning process. The "layer" subsequent to the patterning process contains at least one "pattern".

FIG. 1A is a schematic diagram of a structure of an array substrate in some technologies. As shown in FIG. 1A, the array substrate may include: a base substrate 10, a gate electrode 11 disposed on the base substrate 10, a gate insulator (GI) layer 12 covering the gate electrode 11, an active layer 13, a source electrode 14 and a drain electrode 15 which are disposed on the gate insulator layer 12, wherein a conductive channel is formed between the source electrode 14 and the drain electrode 15; a first passivation (PVX) layer 16 covering the source electrode 14, the drain electrode 15 and the conductive channel, wherein the first passivation layer 16 is provided with a first via hole exposing the source electrode 14, an organic film (ORG) layer 17 covering the first passivation layer 16, wherein the organic film layer 17 is provided with a second via hole; the second via hole communicates with the first via hole to form a via hole structure exposing the source electrode 14 (i.e., the via hole structure penetrates through the organic film layer 17 and the first passivation layer 16 and exposes the source electrode 14), a pixel electrode 18 disposed on the organic film layer 17, a second passivation layer 19 disposed on the pixel electrode 18, and a common electrode layer 20 disposed on the second passivation layer 19. The common electrode 20 is used for providing a common voltage, the pixel electrode 18 is used for providing a pixel voltage for display, and a multidimensional electric field generated between the common electrode and the pixel electrode drives liquid crystal deflection.

Figure 1B:
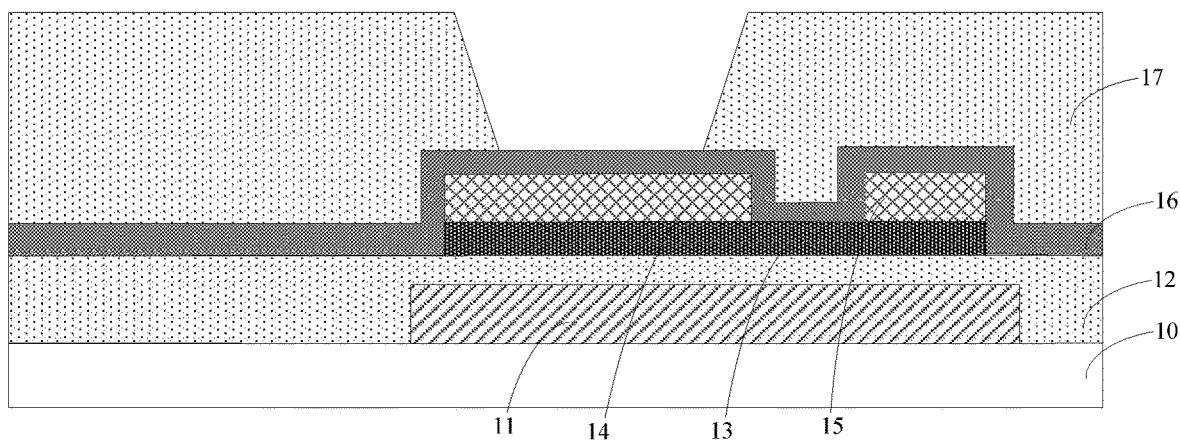
FIG. 1B is a schematic diagram after formation of an organic film layer in some technologies.
Figure 1C:
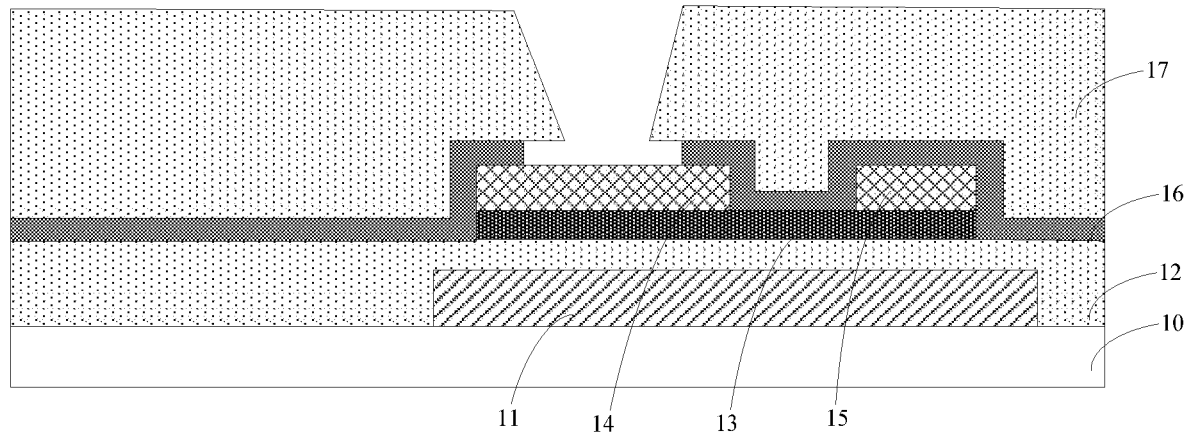
FIG. 1C is a schematic diagram after etching of a first passivation layer in some technologies.
Figure 1D:
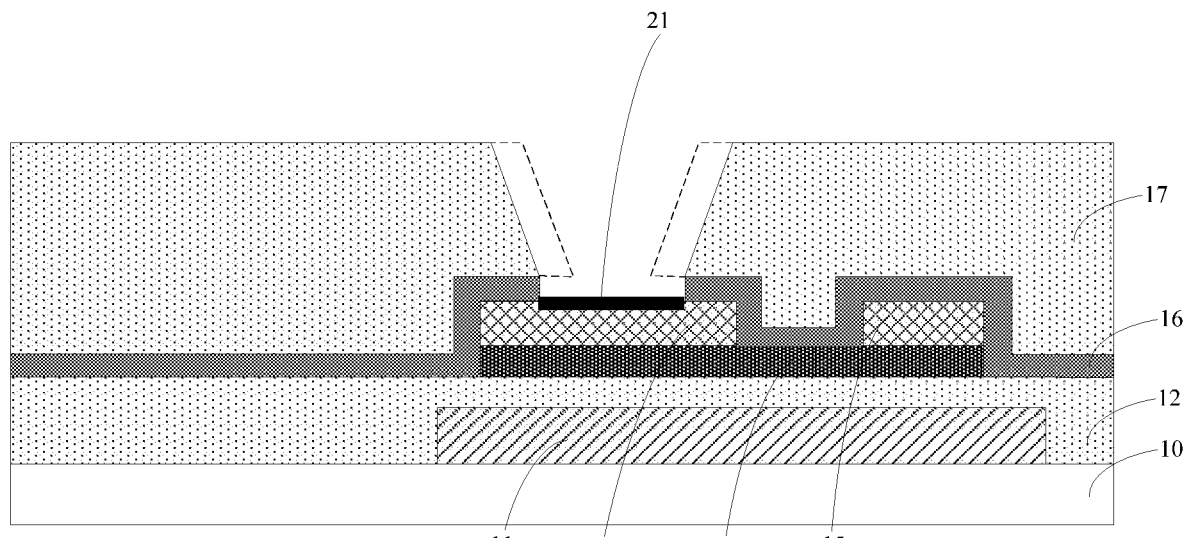
FIG. 1D is a schematic diagram of an organic film layer after ashing treatment in some technologies.

According to the research by the inventor of the present disclosure, as shown in FIG. 1B and FIG. 1C, after a mask process of the organic film layer 17 is finished and the etching process of the first passivation layer 16 is performed, an undercut problem (i.e., a slope angle after the etching is greater than 90 degrees) will occur as shown in FIG. 1C. At this time, the first passivation layer 16 is recessed inward with respect to the organic film layer 17, which will cause the pixel electrode 18 to be open when it is connected to the source electrode 14, which reduces the product yield rate. Next, the organic film layer 17 can be regressed by adding a photoresist ashing process to the organic film layer 17. At this time, as shown in FIG. 1D, the first passivation layer 16 is not recessed inward with respect to the organic film layer 17, but when the photoresist ashing process is performed on the organic film layer 17, oxidation corrosion occurs on some metals in the source electrode 14 (i.e., metals located at the first via hole on the first passivation layer 16), thereby producing a corrosion layer 21. Furthermore, as shown in FIG. 1A, some array substrates are prone to have a corrosion layer 21 between the pixel electrode 18 and the source electrode 14 at the via hole structure, which will still cause the pixel electrode 18 to be open when connected to the source electrode 14, which reduces the product yield rate.

Figure 2A:
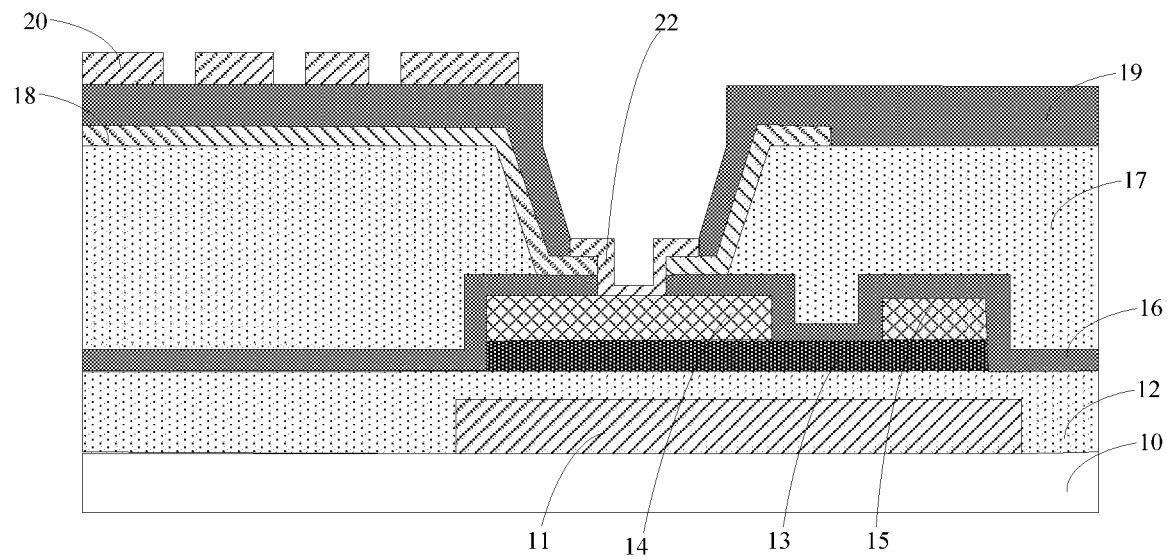
FIG. 2A is a schematic diagram of a structure of an array substrate in an exemplary embodiment of the present disclosure.
Figure 2B:
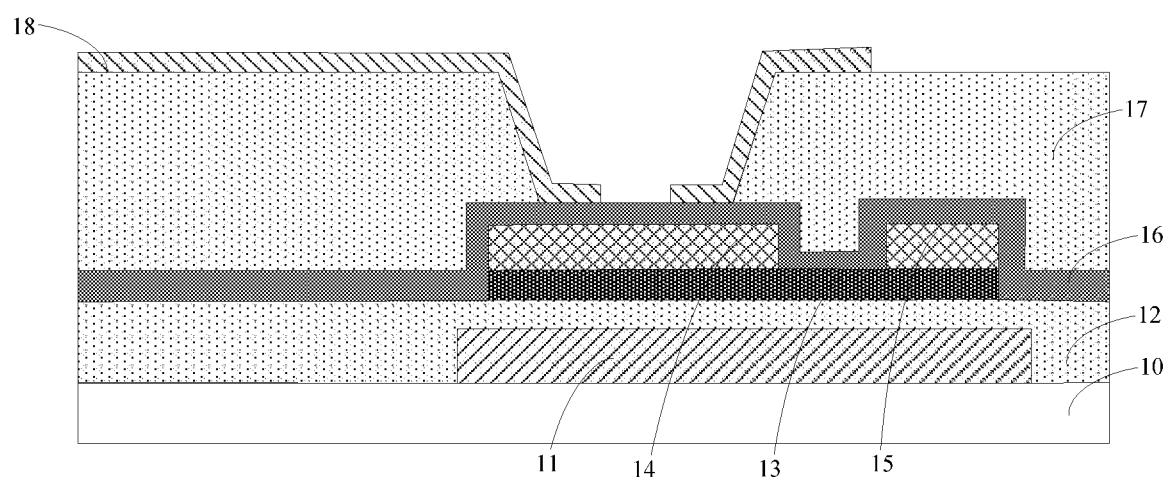
FIG. 2B is a schematic diagram after a pixel electrode is formed in an exemplary embodiment of the present disclosure.
Figure 2C:
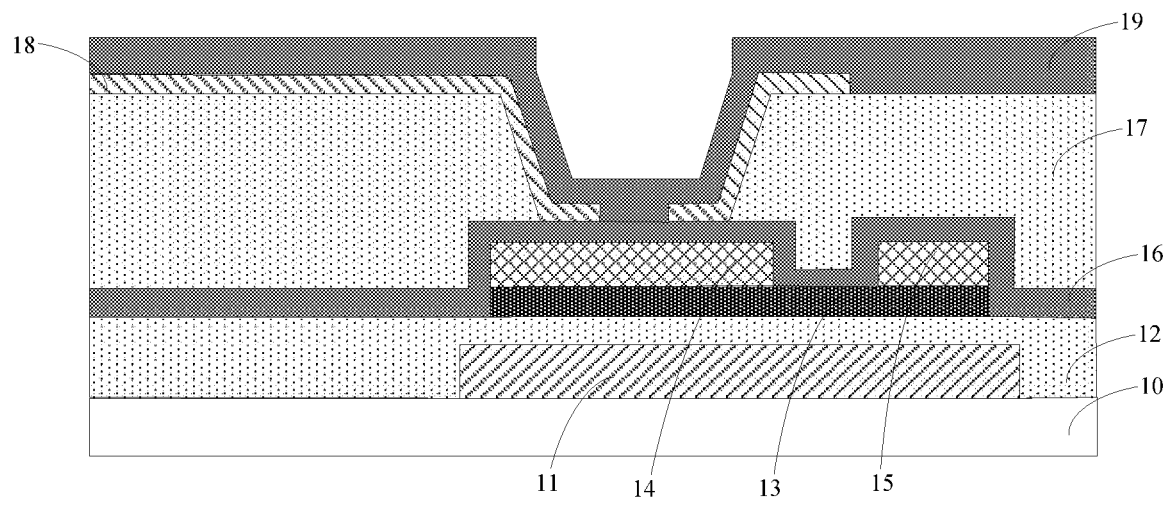
FIG. 2C is a schematic diagram after a second passivation layer is formed in an exemplary embodiment of the present disclosure.
Figure 2D:
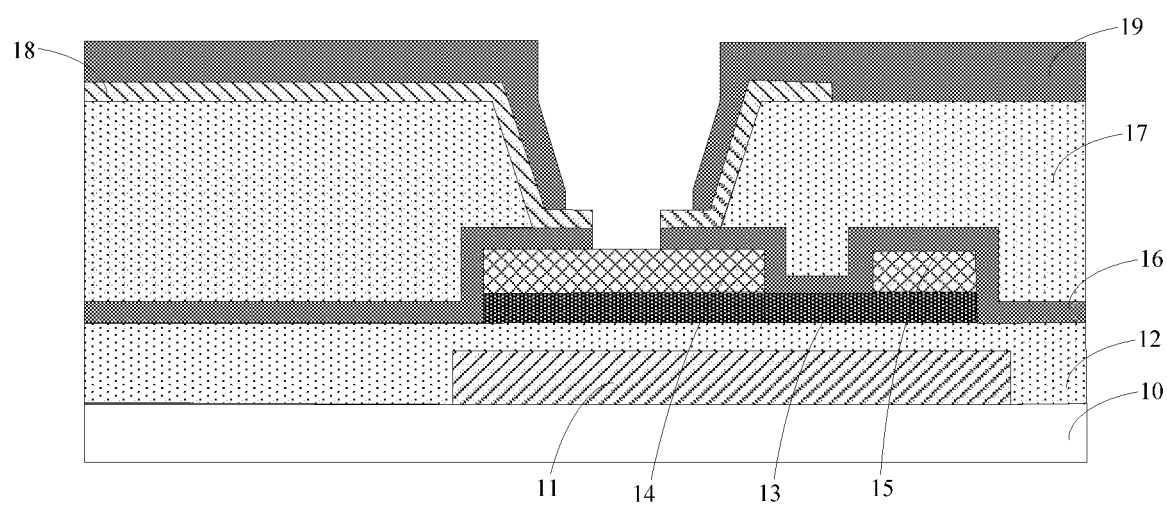
FIG. 2D is a schematic diagram of a second passivation layer and a first passivation layer are etched in an exemplary embodiment of the present disclosure.
Figure 3A:
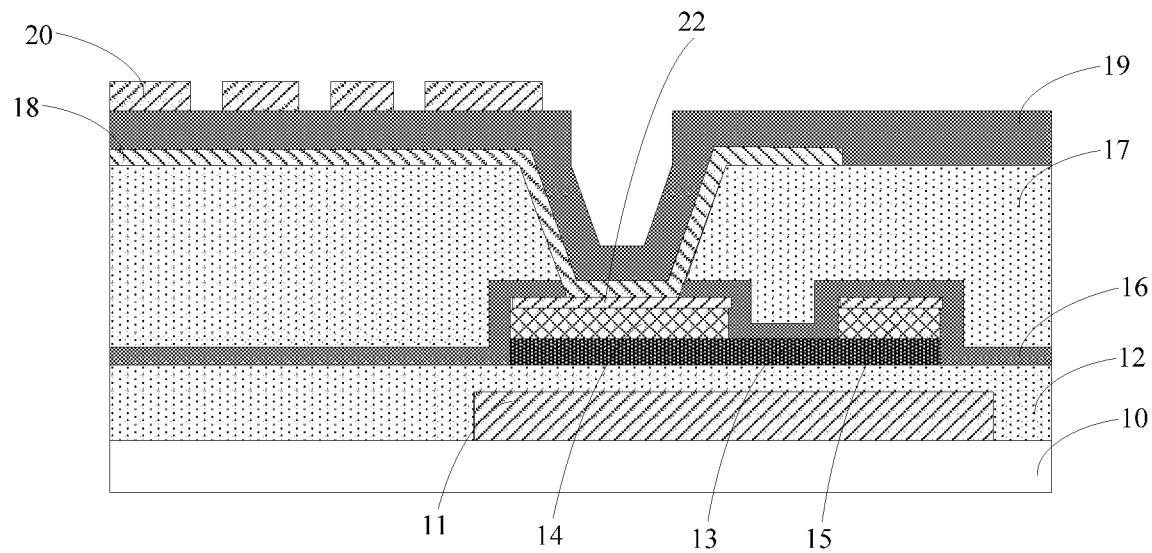
FIG. 3A is a schematic diagram of a structure of an array substrate in another exemplary embodiment of the present disclosure.

An embodiment of the present disclosure provides an array substrate, as shown in FIG. 2A or FIG. 3A, the array substrate may include:
  a base substrate 10;
  a thin film transistor disposed on the base substrate 10;
  a first passivation layer 16, an organic film layer 17 and a pixel electrode 18 disposed on the thin film transistor;
  a connection structure 22 for connect the source electrode 14 and the pixel electrode 18 of the thin film transistor, wherein the connection structure 22 is disposed in a via hole structure exposing the pixel electrode 18 and the source electrode 14, or the connection structure 22 is disposed between the pixel electrode 18 and the source electrode 14.

In an exemplary embodiment, as shown in FIG. 2A or FIG. 3A, the thin film transistor may include a gate electrode 11, an active layer 13, a source electrode 14 and a drain electrode 15, wherein the gate electrode 11 is disposed on the base substrate 10 and a gate insulator layer 12 is covered by the gate electrode 11. The active layer 13, the source electrode 14 and the drain electrode 15 are disposed on the gate insulator layer 12, and a conductive channel is formed between the source electrode 14 and the drain electrode 15.

In an exemplary embodiment, as shown in FIG. 2A, the array substrate may further include a second passivation layer 19 disposed on a side of the pixel electrode 18 away from the base substrate 10. The connection structure 22 is disposed in the via hole structure exposing the pixel electrode 18 and the source electrode 14, and may include: a first via hole exposing the source electrode 14 formed on the first passivation layer 16; a second via hole communicated with the first via hole formed on the organic film layer 17; a third via hole communicated with the second via hole formed on the pixel electrode 18; a fourth via hole which communicates with the third via hole and exposes the pixel electrode formed on the second passivation layer 19; wherein the fourth via hole, the third via hole, the second via hole and the first via hole form the via hole structure exposing the pixel electrode 18 and the source electrode 14, and the connection structure 22 is connected to the pixel electrode 18 and the source electrode 14 through the via hole structure.

In this way, the source electrode and pixel electrode are exposed at the same time by using the via hole structure, and the connection structure is disposed at the position where the via hole structure is located, so that on the one hand, the connection structure may be connected to the source electrode and pixel electrode exposed in the via hole structure, and on the other hand, the connection structure may cover the exposed source electrode and pixel electrode in the via hole structure, thus ensuring effective connection between the pixel electrode and the source electrode, which improves the product yield rate.

In an exemplary embodiment, as shown in FIG. 2A, the array substrate may further include: a second passivation layer 19 disposed on a side of the pixel electrode 18 away from the base substrate 10 and a common electrode 20 disposed on a side of the second passivation layer 19 away from the base substrate 10; wherein the connection structure 22 and the common electrode 20 may be disposed in the same layer and made of a same material. In this way, the common electrode and the connection structure may be formed through a one-time patterning process.

In an exemplary embodiment, the material of the connection structure may include indium tin oxide or indium zinc oxide.

In an exemplary embodiment, as shown in FIG. 3A, the connection structure 22 is disposed between the pixel electrode 18 and the source electrode 14, and may include: the connection structure 22 is disposed on a side of the source electrode 14 away from the base substrate 10; the first passivation layer 16 is disposed on a side of the connection structure 22 away from the base substrate 10, and is provided with a first via hole exposing the connection structure 22; the organic film layer 17 is provided with a second via hole communicating with the first via hole; the second via hole and the first via hole form the via hole structure exposing the connection structure 22; and the pixel electrode 18 is connected to the connection structure 22 through the via hole structure, and the connection structure 22 is connected to the source electrode 14.

In an exemplary embodiment, the material of the connection structure is an oxidation-resistant and conductive material.

In an exemplary embodiment, an anti-corrosion and conductive material includes any one of chromium-cobalt alloy, nickel-chromium alloy and tellurium-nickel-chromium alloy.

In an exemplary embodiment, the array substrate may also include other film layers, such as common electrode (Com) leads or planarization layers or touch leads, which are not limited here.

In an exemplary embodiment, the organic film layer is disposed on a side of the pixel electrode close to the base substrate, and is used for separating the Touch/Com leads (for example, being disposed in the same layer and made of the same material as the source electrode and the drain electrode) from the material of the pixel electrode source.

In an exemplary embodiment, organic materials such as polyimide and naphthoquinonediazide compound may be used for the organic film layer.

In an exemplary embodiment, the first passivation layer is disposed on a side of the organic film layer close to the base substrate, for preventing the organic film layer from polluting the conductive channel.

The array substrate provided by the present disclosure will be described in detail below by taking an example where the connection structure for connecting the source electrode and the pixel electrode of the thin film transistor is arranged in the via hole structure exposing the pixel electrode and the source electrode.

FIG. 2A is a schematic diagram of a structure of an array substrate in an exemplary embodiment of the present disclosure. As shown in FIG. 2A, the array substrate may include:

a base substrate 10;

a gate electrode 11 disposed on the base substrate 10;

a gate insulator layer 12 covering the gate electrode 11;

an active layer 13, a source electrode 14 and a drain electrode 15 disposed on the gate insulator layer 12, wherein a conductive channel is formed between the source electrode 14 and the drain electrode 15;

a first passivation layer 16 covering the source electrode 14, the drain electrode 15 and the conductive channel, wherein the first passivation layer 16 is provided with a first via hole exposing the source electrode 14;

an organic film layer 17 covering the first passivation layer 16, wherein the organic film layer 17 is provided with a second via hole which is communicated with the first via hole;

a pixel electrode 18 disposed on the organic film layer 17, and a third via hole is provided on the pixel electrode 18, wherein a first end of the pixel electrode 18 extends into the second via hole, and a second end of the pixel electrode 18 extends into the second via hole; the third via hole is located between the first end of the pixel electrode 18 and the second end of the pixel electrode 18, and the third via hole is in communication with the first via hole;

a second passivation layer 19 disposed on the pixel electrode 18, and a fourth via hole is formed on the second passivation layer 19, wherein a first end of the second passivation layer 19 extends into the third via hole, and the second end of the second passivation layer 19 extends into the third via hole; the fourth via hole is located between the first end of the second passivation layer 19 and the second end of the second passivation layer 19, the fourth via hole communicates with the first via hole, and the fourth via hole exposes the pixel electrode 18;

a common electrode 20 and a connection structure 22 disposed on the second passivation layer 19, wherein the connection structure 22 is located in a via hole structure. The via hole structure consists of the fourth via hole on the second passivation layer 19, the third via hole on the pixel electrode 18, the second via hole on the organic film layer 17, and the first via hole on the first passivation layer 16 (that is, the via hole structure penetrates the second passivation layer 19, the pixel electrode 18, the organic film layer 17, and the first passivation layer 16), and exposes the source electrode 14 and the pixel electrode 18. The connection structure 22 is disposed at the position of the via hole structure, and is connected to the source electrode 14 exposed in the via hole structure and the pixel electrode 18 exposed in the via hole structure. That is, the connection structure 22 is connected to the source electrode 14 and the pixel electrode 18 at the same time through the via hole structure.

In an exemplary embodiment, as shown in FIG. 2A, the gate electrode 11, the active layer 13, the source electrode 14, and the drain electrode 15 may form a thin film transistor.

In an exemplary embodiment, as shown in FIG. 2A, the pixel electrode 18 may be a plate electrode, and the common electrode 20 may be a slit electrode, wherein the pixel electrode 18 and the common electrode 20 together form a multi-dimensional electric field to drive liquid crystal deflection.

In an exemplary embodiment, the common electrode 20 and the connection structure 22 may be disposed in a same layer and made of a same material. For example, both the common electrode 20 and the connection structure 22 may be made of a conductive material such as indium tin oxide (ITO) and indium zinc oxide (IZO). Here, being disposed in the same layer means that they may be made through a one-time patterning process. A one-time patterning process refers to a process of forming the required layer structure through one-time exposure. The one-time patterning process may include processes such as deposition of film layer, photoresist coating, mask exposure, development, etching, and stripping of photoresist.

Taking the array substrate as shown in FIG. 2A as an example, the technical solutions of the embodiments of the present disclosure will be described through a manufacturing process of the array substrate provided by an embodiment of the present disclosure.

As shown in FIGS. 2A to 2D, a method for manufacturing an array substrate according to an embodiment of the present disclosure may include:

S21: forming a gate electrode 11 on a base substrate 10.

S22: forming a gate insulator layer 12 covering the gate electrode 11, and forming an active layer 13, a source electrode 14 and a drain electrode 15 on the gate insulator layer 12, and forming a conductive channel between the source electrode 14 and the drain electrode 15.

S23: forming a first passivation layer 16 covering the source electrode 14, the drain electrode 15 and the conductive channel.

S24: forming an organic film layer 17 covering the first passivation layer 16, wherein the organic film layer 17 is provided with a second via hole.

S25: forming a pixel electrode 18 disposed on the organic film layer 17, and the pixel electrode 18 is provided with a third via hole, wherein a first end of the pixel electrode 18 extends into the second via hole, and a second end of the pixel electrode 18 extends into the second via hole; the third via hole is located between the first end of the pixel electrode 18 and the second end of the pixel electrode 18, and the third via hole is in communication with the second via hole;

S26: forming a second passivation layer 19 disposed on the pixel electrode 18, and forming a fourth via hole which exposes the pixel electrode 18 on the second passivation layer and a first via hole which exposes the source electrode 14 on the first passivation layer.

Among them, the first via hole is connected to the second via hole. A first end of the second passivation layer 19 extends into the third via hole, and a second end of the second passivation layer 19 extends into the third via hole. The fourth via hole is located between the first end of the second passivation layer 19 and the second end of the second passivation layer 19, and the fourth via hole communicates with the first via hole. The via hole structure may be formed by the first via hole, the second via hole, the third via hole, and the fourth via hole. The second passivation layer 19, the pixel electrode 18, the organic film layer 17 and the first passivation layer 16 in the via hole structure are etched away, simultaneously exposing the source electrode 14 and the pixel electrode 18.

S27: forming a common electrode 20 and a connection structure 22 on the second passivation layer 19, wherein the connection structure 22 is located in the via hole structure (formed by the first via hole, the second via hole, the third via hole and the fourth via hole), and is connected to the source electrode 14 exposed in the via hole structure and the pixel electrode 18 exposed in the via hole structure; that is, the connection structure 22 is connected to the source electrode 14 and the pixel electrode 18 at the same time through the via hole structure.

In an exemplary embodiment, Step S21 may include:

S211: depositing a first metal thin film on the base substrate.

S212: coating a layer of photoresist on the first metal thin film, performing step exposure and development on the photoresist by using a halftone or gray tone mask to form an unexposed region (photoresist with a first thickness) at the position of the gate electrode and a fully exposed region (without photoresist) at other positions.

S213: etching the fully exposed region through an etching process to remove the first metal thin film in the fully exposed region, and forming the gate electrode on the base substrate.

In an exemplary embodiment, the base substrate may be glass, plastic, or a flexible transparent plate.

In an exemplary embodiment, the first metal thin film may be made of a metal material such as aluminum, copper, molybdenum, titanium, niobium, silver, gold, tantalum, tungsten, chromium, etc., and may also be made of conductive oxides such as indium tin oxide (ITO), indium zinc oxide (IZO), zinc oxide (ZnO), indium oxide (In2O3), aluminum-doped zinc oxide (AlZnO), etc. It may be of a single-layer structure or a multilayer composite structure.

In an exemplary embodiment, Step S22 may include:

S221: sequentially depositing a gate insulating thin film, a semiconductor thin film and a second metal thin film on the base substrate on which the gate electrode is formed.

S222: coating a layer of photoresist on the second metal thin film, performing step exposure and development on the photoresist by using a halftone or gray tone mask to form an unexposed region (photoresist with the first thickness) at positions of the source and drain electrodes, partially exposed regions (photoresist with a second thickness) at a position of the conductive channel, and fully exposed regions (without photoresist) at other positions. Here, the first thickness is greater than the second thickness.

S223: etching the fully exposed region through a first etching process to remove the second metal thin film and the semiconductor thin film in the region.

S224: removing the photoresist in the partially exposed region through an ashing process to expose the second metal thin film.

S225: etching the second metal thin film in the partially exposed region by a second etching process to etch off the second metal thin film in the region, stripping off the remaining photoresist to form a gate insulator layer, an active layer, a source electrode and a drain electrode on the base substrate, forming a conductive channel between the source electrode and the drain electrode, and keeping a semiconductor thin film below the source electrode and the drain electrode.

In an exemplary embodiment, the gate insulating thin film may be made of silicon nitride (SiNx), silicon oxide (SiOx), or silicon oxynitride (Si(ON)x). It may be of a single layer structure, a double layer structure or a multilayer structure, and may be deposited by chemical vapor deposition (CVD) or plasma enhanced chemical vapor deposition (PECVD).

In an exemplary embodiment, the second metal thin film may be one or a mixture of metal materials such as aluminum, copper, molybdenum, niobium, titanium, silver, gold, tantalum, tungsten, chromium, etc., It may be of a single layer structure, a double-layer structure or multilayer structure, and may be deposited by a radio frequency magnetron sputtering method.

In an exemplary embodiment, Step S23 may include:

S231: depositing a first passivation thin film on the base substrate on which the gate insulator layer, the active layer, the source electrode and the drain electrode are formed.

S232: coating a layer of photoresist on the first passivation thin film, exposing and developing the photoresist with a single tone mask to form a fully exposed region (without photoresist) at the position of the first via hole and unexposed regions (photoresist kept) at other positions.

In an exemplary embodiment, the first passivation thin film may be one or a mixture of inorganic materials such as silicon nitride (SiNx), silicon oxide (SiOx), silicon oxynitride (Si(ON)x). It may be of a single layer structure, a double layer structure or a multilayer structure, and may be deposited by chemical vapor deposition (CVD) or plasma enhanced chemical vapor deposition (PECVD).

In an exemplary embodiment, Step S24 may include:

S241: depositing an organic thin film on the first passivation layer.

S242: coating a layer of photoresist on the organic thin film, exposing and developing the photoresist with a single tone mask to form a fully exposed region with no photoresist at the position of the second via hole and unexposed regions with the photoresist kept at other positions.

S243: etching the fully exposed region through an etching process to remove the organic thin film in the region, and forming an organic film layer provided with a second via hole, wherein the second via hole is communicated with the first via hole.

In an exemplary embodiment, organic materials such as polyimide and naphthoquinonediazide compound may be used for the organic thin film.

In an exemplary embodiment, Step S25 may include:

S251: depositing a first transparent conductive thin film on the organic film layer and the first passivation layer.

S252: coating a layer of photoresist on the first transparent conductive thin film, exposing and developing the photoresist with a single tone mask to form a fully exposed region (without photoresist) at the position of the third via hole, and form unexposed regions at other positions, with the photoresist kept.

S253: etching the fully exposed region through an etching process to remove the first transparent conductive thin film in the region to form the pixel electrode with the third via hole, wherein a first end of the pixel electrode extends into the second via hole, and a second end of the pixel electrode extends into the second via hole; the third via hole is located between the first end of the pixel electrode and the second end of the pixel electrode, and the third via hole is in communication with the first via hole;

In an exemplary embodiment, the first transparent conductive thin film may be made of indium tin oxide (ITO) or indium zinc oxide (IZO), and may be deposited by a radio frequency magnetron sputter method.

In an exemplary embodiment, Step S26 may include:

S261: depositing a second passivation thin film on the pixel electrode and the organic film layer.

S262: coating a layer of photoresist on the second passivation thin film, exposing and developing the photoresist with a single tone mask to form a fully exposed region (without photoresist) at the position of the fourth via hole and unexposed regions (photoresist kept) at other positions.

S263: etching the fully exposed region of the second passivation thin film and the fully exposed region of the first passivation thin film through an etching process to remove the second passivation thin film and the first passivation thin film in the corresponding regions; forming the second passivation layer with the fourth via hole and the first passivation layer with the first via hole, wherein a first end of the second passivation layer extends into the third via hole, and the second end of the second passivation layer extends into the third via hole; the fourth via hole is located between the first end of the second passivation layer and the second end of the second passivation layer, and the fourth via hole communicates with the first via hole; the first via hole exposes the source electrode, and the via hole structure may be formed by the first via hole, the second via hole, the third via hole, and the fourth via hole. The second passivation layer, the pixel electrode, the organic film layer and the first passivation layer in the via hole structure are etched away, exposing the source electrode and the pixel electrode at the same time.

In an exemplary embodiment, the second passivation thin film may be one or a mixture of inorganic materials such as silicon nitride (SiNx), silicon oxide (SiOx), silicon oxynitride (Si(ON)x). It may be of a single layer structure, a double layer structure or a multilayer structure, and may be deposited by chemical vapor deposition (CVD) or plasma enhanced chemical vapor deposition (PECVD).

In an exemplary embodiment, Step S27 may include:

S271: depositing a second transparent conductive thin film on the second passivation layer.

S272, coating a layer of photoresist on the second transparent conductive thin film, exposing and developing the photoresist with a single tone mask to form an unexposed region with photoresist kept at positions of the common electrode and the connection structure and fully exposed regions with no photoresist at other positions.

S273, etching the fully exposed region through an etching process to remove the second transparent conductive thin film in the region to form the common electrode and the connection structure; wherein the common electrode is a slit electrode; the connection structure is disposed at the position where the via hole structure is located, and is connected to the source electrode exposed in the via hole structure and the pixel electrode exposed in the via hole structure; that is, the connection structure is connected to the source electrode and the pixel electrode at the same time through the via hole structure.

In an exemplary embodiment, the second transparent conductive thin film may be made of indium tin oxide (ITO) or indium zinc oxide (IZO), and may be deposited by a radio frequency magnetron sputter method.

Although the manufacturing process of the array substrate in the embodiment of the present disclosure has been described by taking a seven-time patterning process as an example, in practice, the array substrate in the embodiment of the present disclosure may also be manufactured by other methods. For example, the gate electrode, the gate insulator layer, the active layer, the source electrode and the drain electrode may be completed through a two-time patterning process, in which the gate electrode is formed through a one-time patterning process, and then the gate insulator layer, the active layer, the source electrode and the drain electrode are formed through another time of patterning process. For another example, the gate insulator layer, the active layer, the source electrode and the drain electrode may also be completed through a two-time patterning process, in which the gate insulator layer and the active layer are formed through a one-time patterning process, and then the source electrode and the drain electrode are formed through another time of patterning process. For another example, the common electrode and the connection structure may also be completed by a two-time patterning process, in which the common electrode is formed through a one-time patterning process, and then the connection structure is formed through another time of patterning process.

According to an array substrate provided by an embodiment of the present disclosure, a via hole structure penetrating through the second passivation layer, the pixel electrode, the organic film layer and the first passivation layer is provided. The source electrode and the pixel electrode are exposed at the same time by using the via hole structure. The connection structure is disposed at the position where the via hole structure is located, and the connection structure is connected to the source electrode and the pixel electrode at the same time through the via hole structure. In this way, after finishing the mask process of the organic film layer, there is no need to perform an etch process on the first passivation layer, so that the undercut problem will not occur. Then, there is no need to add an ashing process to the organic film layer to regress the organic film layer, so that some metals in the source electrode (i.e., the metal located at the first via hole on the first passivation layer) will not undergo oxidation corrosion, and thus no corrosion layer will be generated. On the one hand, the connection structure is connected to the source electrode exposed in the via hole structure, on the other hand, it is connected to the pixel electrode exposed in the via hole structure, which can ensure the effective connection between the pixel electrode and the source electrode, which improves the product yield rate.

The array substrate provided by the present disclosure will be described in detail below by taking the example where the connection structure connecting the source electrode and the pixel electrode of the thin film transistor is arranged between the pixel electrode and the source electrode.

FIG. 3A is a schematic diagram of a structure of an array substrate in another exemplary embodiment of the present disclosure. As shown in FIG. 3A, another array substrate according to an embodiment of the present disclosure may include:

- a base substrate 10;
- a gate electrode 11 disposed on the base substrate 10;
- a gate insulator layer 12 covering the gate electrode 11;
- an active layer 13, a source electrode 14 and a drain electrode 15 disposed on the gate insulator layer 12, wherein a conductive channel is formed between the source electrode 14 and the drain electrode 15;
- a connection structure 22 covering the source electrode 14 and the drain electrode 15;
- a first passivation layer 16 covering the connection structure 22 and the conductive channel, wherein the first passivation layer 16 is provided with a first via hole exposing the connection structure 22, and a second connection structure is connected to the source electrode at the position where the first via hole is located;
- an organic film (ORG) layer 17 covering the first passivation layer 16, and the organic film layer 17 is provided with a second via hole; the second via hole communicates with the first via hole to form a via hole structure exposing the connection structure 22 (i.e., the via hole structure penetrates through the organic film layer 17 and the first passivation layer 16 and exposes the connection structure 22);
- a pixel electrode 18 disposed on the organic film layer 17, and the pixel electrode 18 is recessed toward the base substrate at the position of the via hole structure to form a first groove; the first groove formed by the pixel electrode 18 is disposed in the via hole structure, wherein a groove bottom of the first groove is connected to the connection structure 22, that is, the connection structure 22 is connected to the source electrode 14 on the one hand, and is connected to the pixel electrode 18 through the via hole structure on the other hand, that is, the pixel electrode 18 is connected to the source electrode 14 through the second connection structure 22 and the via hole structure;
- a second passivation layer 19 covering the pixel electrode 18 and the organic film layer 17, and the second passivation layer 19 is recessed toward the base substrate to form a second groove, wherein the second groove formed by the second passivation layer 19 is disposed in the first groove; and
- a common electrode layer 20 disposed on the second passivation layer 19.

In an exemplary embodiment, the gate electrode 11, the active layer 13, the source electrode 14, and the drain electrode 15 may form a thin film transistor.

In an exemplary embodiment, the first passivation layer is disposed on a side of the organic film layer close to the base substrate, for preventing the organic film layer from polluting the conductive channel.

In an exemplary embodiment, the pixel electrode 18 may be a plate electrode, and the common electrode 20 may be a slit electrode, wherein the pixel electrode 18 and the common electrode 20 together form a multi-dimensional electric field to drive liquid crystal deflection.

In an exemplary embodiment, the connection structure may be made of chromium cobalt alloy, nickel-chromium alloy, tellurium-nickel-chromium alloy and other materials which are resistant to oxidation and conduct electricity.

Taking the array substrate as shown in FIG. 3A as an example, the technical solutions of the embodiments of the present disclosure will be described through the manufacturing process of another array substrate provided by the embodiments of the present disclosure.

As shown in FIGS. 3A to 3D, a method for manufacturing another array substrate according to an embodiment of the present disclosure may include:

S31: forming a gate electrode 11 on a base substrate 10.

S32: forming a gate insulator layer 12 covering the gate electrode 11, and forming an active layer 13, a source electrode 14 and a drain electrode 15 on the gate insulator layer 12, and forming a conductive channel between the source electrode 14 and the drain electrode 15.

S33: forming a connection structure 22 covering the source electrode 14 and the drain electrode 15.

S34: forming a first passivation layer 16 covering the connection structure 22 and the conductive channel, and forming an organic film layer 17 covering the first passivation layer 16, wherein the first passivation layer 16 is provided with a first via hole exposing the connection structure 22, the connection structure 23 is connected to the source electrode 14 at the position of the first via hole, and the organic film layer 17 is provided with a second via hole communicating with the first via hole to form a via hole structure exposing the connection structure 22 (that is, the via hole structure penetrates through the organic film layer 17 and the first passivation layer 16, and exposes the connection structure 22);

S35: forming a pixel electrode 18 disposed on the organic film layer 17, and the pixel electrode 18 is recessed toward the base substrate at the position of the via hole structure to form a first groove; the first groove formed by the pixel electrode 18 is disposed in the via hole structure, wherein a groove bottom of the first groove is connected to the connection structure 22, that is, the connection structure 22 is connected to the source electrode 14 on the one hand, and is connected to the pixel electrode 18 through the via hole structure on the other hand, that is, the connection structure 22 is connected to the source electrode 14 and the pixel electrode 18 at the same time.

S36: forming a second passivation layer 19 covering the pixel electrode 18, and the second passivation layer 19 is recessed toward the base substrate to form a second groove, wherein the second groove formed by the second passivation layer 19 is disposed in the first groove.

S37: forming a common electrode layer 20 disposed on the second passivation layer 19.

In an exemplary embodiment, Step S31 may include:

S311: depositing a first metal thin film on the base substrate.

S312: coating a layer of photoresist on the first metal thin film, performing step exposure and development on the photoresist by using a halftone or gray tone mask to form an unexposed region at the position of the gate electrode, having photoresist with a first thickness, and form a fully exposed region at other positions, without any photoresist.

S313: etching the fully exposed region through an etching process to remove the first metal thin film in the fully exposed region, and forming the gate electrode on the base substrate.

In an exemplary embodiment, the base substrate may be glass, plastic, or a flexible transparent plate.

In an exemplary embodiment, the first metal thin film may be made of a metal material such as aluminum, copper, molybdenum, titanium, niobium, silver, gold, tantalum, tungsten, chromium, etc., and may also be made of a conductive oxide such as indium tin oxide (ITO), indium zinc oxide (IZO), zinc oxide (ZnO), indium oxide (In2O3), aluminum-doped zinc oxide (AlZnO), etc., It may be of a single-layer structure or a multilayer composite structure.

In an exemplary embodiment, Step S32 may include:
S321, sequentially depositing a gate insulating thin film, a semiconductor thin film and a second metal thin film on the base substrate on which the gate electrode is formed.
S322, coating a layer of photoresist on the second metal thin film, performing step exposure and development on the photoresist by using a halftone or gray tone mask to form unexposed regions with photoresist with the first thickness at the position of the source and drain electrodes, and a partially exposed region with photoresist with a second thickness at the position of the conductive channel, and fully exposed regions with no photoresist at other positions. Here, the first thickness is greater than the second thickness.
S323, etching the fully exposed region through a first etching process to remove the second metal thin film and the semiconductor thin film in the fully exposed region.
S324, removing the photoresist in the partially exposed region through an ashing process to expose the second metal thin film.
S325, etching the second metal thin film in the partially exposed region by a second etching process to etch off the second metal thin film in the partially exposed region, stripping off the remaining photoresist to form the gate insulator layer, the active layer, the source electrode and the drain electrode on the base substrate, forming the conductive channel between the source electrode and the drain electrode, and keeping a semiconductor thin film below the source electrode and the drain electrode.

In an exemplary embodiment, the gate insulating thin film may be made of silicon nitride (SiNx), silicon oxide (SiOx), or silicon oxynitride (Si(ON)x). It may be of a single layer structure, a double layer structure or a multilayer structure, and may be deposited by chemical vapor deposition (CVD) or plasma enhanced chemical vapor deposition (PECVD).

In an exemplary embodiment, the second metal film may be one or a mixture of metal materials such as aluminum, copper, molybdenum, niobium, titanium, silver, gold, tantalum, tungsten, chromium, etc., It may be of a single layer structure, a double-layer structure or multilayer structure, and may be deposited by a radio frequency magnetron sputtering method.

In an exemplary embodiment, Step S33 may include:
S331: depositing an oxidation-resistant conductive thin film on the source electrode and the drain electrode, and forming the connection structure on a side of the source electrode and the drain electrode away from the base substrate.

In an exemplary embodiment, the oxidation-resistant conductive thin film may be made of chromium-cobalt alloy, nickel-chromium alloy, tellurium-nickel-chromium alloy and other materials that resist oxidation, corrosion and conduction. It may be of a single layer structure, a double-layer structure or multilayer structure, and may be deposited by a radio frequency magnetron sputtering method.

Figure 3B:
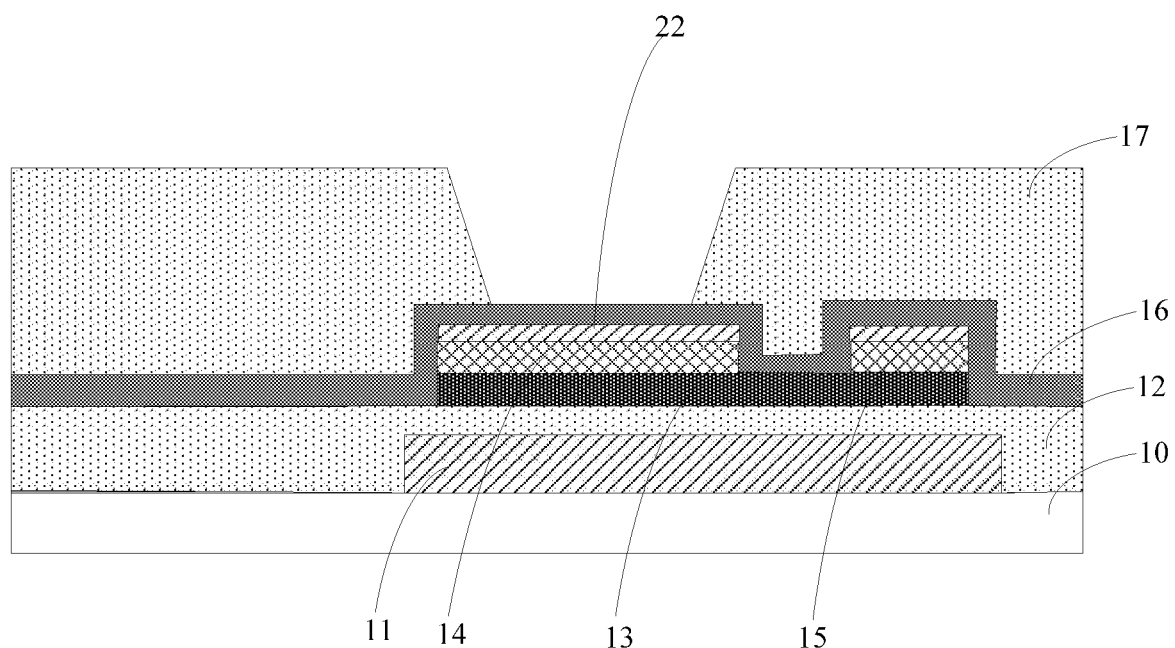
FIG. 3B is a schematic diagram after an organic film layer is formed in another exemplary embodiment of the present disclosure.
Figure 3C:
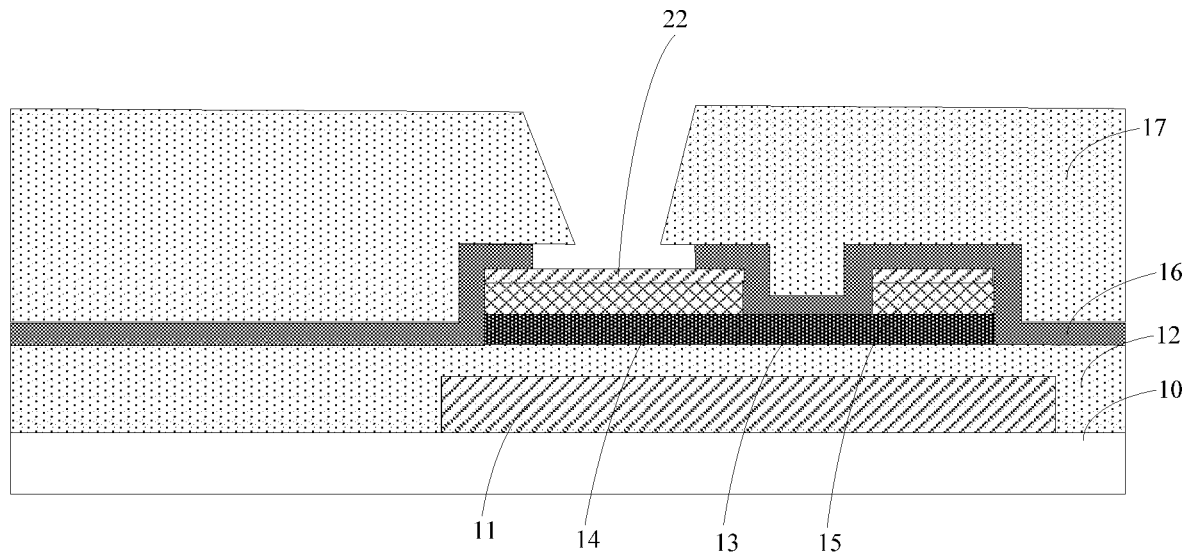
FIG. 3C is a schematic diagram after a first passivation layer is etched in another exemplary embodiment of the present disclosure.
Figure 3D:
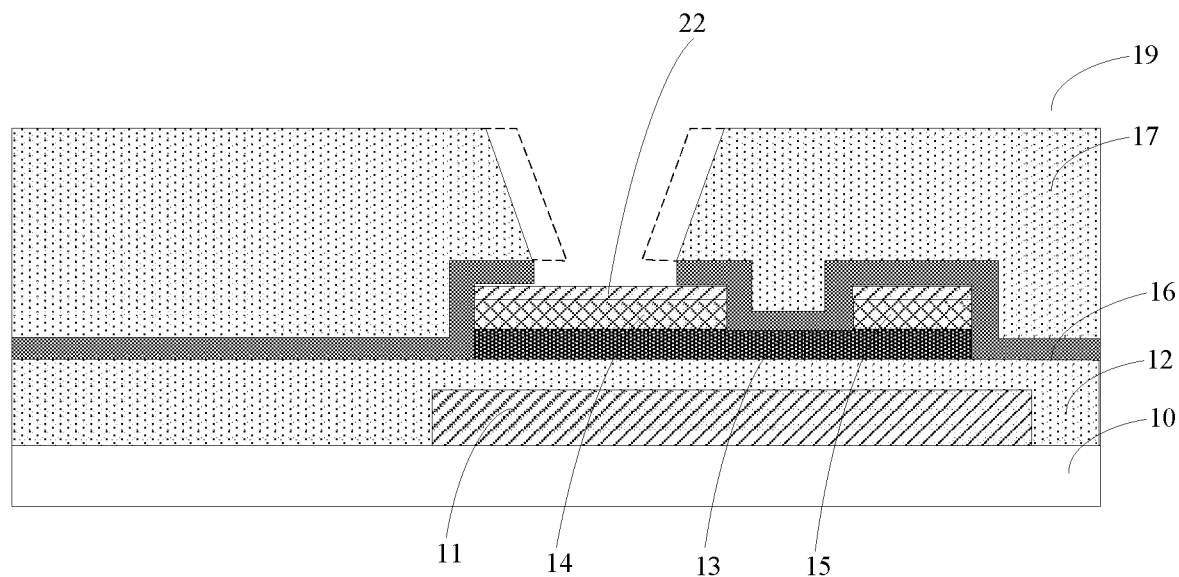
FIG. 3D is a schematic diagram of an organic film layer after ashing treatment in another exemplary embodiment of the present disclosure.

In an exemplary embodiment, as shown in FIGS. 3B to 3D, step S34 may include:
S341: depositing a first passivation thin film on the base substrate on which the gate insulator layer, the active layer, the source electrode, the drain electrode and the connection structure 22 are formed;
S342: coating a layer of photoresist on the first passivation thin film, exposing and developing the photoresist with a single tone mask to form a fully exposed region (without photoresist) at the position of the connection structure and unexposed regions (photoresist kept) at other positions.
S343: depositing an organic thin film on the first passivation thin film.
S344: coating a layer of photoresist on the organic thin film, exposing and developing the photoresist with a half tone or a gray tone mask to form a partially exposed region (photoresist with a second thickness) and a fully exposed region (without photoresist) at the position of the second via hole, and unexposed regions (photoresist with a first thickness, wherein the first thickness is greater than the second thickness) at other positions;
S345: etching the fully exposed region of the organic thin film through an etching process to remove the organic thin film in the region, as shown in FIG. 3C, and forming an organic film layer 17 provided with a second via hole to be processed;
S346: etching the fully exposed region of the first passivation thin film through an etching process to remove the first passivation thin film in the fully exposed region, and forming the first passivation layer 16 with the first via hole, wherein the first via hole exposes the connection structure 22, and the connection structure 22 is connected to the source electrode 14 at the position where the first via hole is located;
S347: removing the photoresist in the partially exposed region of the organic thin film through an ashing process to regress the organic thin film, as shown in FIG. 3D, and forming an organic film layer 17 provided with a second via hole, wherein the second via hole communicates with the first via hole to form the via hole structure exposing the connection structure 22 (i.e., the via hole structure penetrates through the organic film layer 17 and the first passivation layer 16 and exposes the connection structure 22).

In an exemplary embodiment, the first passivation thin film may be one or a mixture of inorganic materials such as silicon nitride (SiNx), silicon oxide (SiOx), silicon oxynitride (Si(ON)x). It may be of a single layer structure, a double layer structure or a multilayer structure, and may be deposited by chemical vapor deposition (CVD) or plasma enhanced chemical vapor deposition (PECVD).

In an exemplary embodiment, organic materials such as polyimide and naphthoquinonediazide compound may be used for the organic thin film.

In an exemplary embodiment, Step S35 may include:
S351: depositing a first transparent conductive thin film on the organic film layer and the connection structure.
S352: coating a layer of photoresist on the first transparent conductive thin film, exposing and developing the photoresist with a single tone mask to form a fully exposed region (without photoresist) at the position of the pixel electrode and unexposed regions (photoresist kept) at other positions;

S353: etching the fully exposed region through an etching process to remove the first transparent conductive thin film in the region to form the pixel electrode; wherein the pixel electrode 18 is recessed toward the base substrate at the position of the via hole structure to form a first groove; the first groove formed by the pixel electrode 18 is disposed in the via hole structure, wherein a groove bottom of the first groove is connected to the connection structure 22, that is, the connection structure 22 is connected to the source electrode 14 on the one hand, and is connected to the pixel electrode 18 through the via hole structure on the other hand, that is, the connection structure 22 is connected to the source electrode 14 and the pixel electrode 18 at the same time.

In an exemplary embodiment, the first transparent conductive thin film may be made of indium tin oxide (ITO) or indium zinc oxide (IZO), and may be deposited by a radio frequency magnetron sputter method.

In an exemplary embodiment, Step S36 may include:

S361: depositing a second passivation thin film on the pixel electrode and the organic film layer.

In an exemplary embodiment, the second passivation thin film may be one or a mixture of inorganic materials such as silicon nitride (SiNx), silicon oxide (SiOx), silicon oxynitride (Si(ON)x). It may be a in a single layer structure, a double layer structure or a multilayer structure, and may be deposited by chemical vapor deposition (CVD) or plasma enhanced chemical vapor deposition (PECVD).

In an exemplary embodiment, Step S37 may include:

S371: depositing a second transparent conductive thin film on the second passivation layer.

S372: coating a layer of photoresist on the second transparent conductive thin film, exposing and developing the photoresist with a single tone mask to form a unexposed region (photoresist kept) at the position of the common electrode and fully exposed regions (without photoresist) at other positions; and S373, etching the fully exposed region through an etching process to remove the second transparent conductive thin film in the fully exposed region to form the common electrode; wherein the common electrode may be a slit electrode.

In an exemplary embodiment, the second transparent conductive thin film may be made of indium tin oxide (ITO) or indium zinc oxide (IZO), and may be deposited by a radio frequency magnetron sputter method.

Of course, in actual implementation, another array substrate provided in the embodiment of the present disclosure may also be manufactured by other methods. For example, the gate electrode, the gate insulator layer, the active layer, the source electrode and the drain electrode may be completed through a two-time patterning process, in which the gate electrode is formed through a one-time patterning process, and then the gate insulator layer, the active layer, the source electrode and the drain electrode are formed through another time of patterning process. For another example, the gate insulator layer, the active layer, the source electrode and the drain electrode may also be completed through a two-time patterning process, in which the gate insulator layer and the active layer are formed through a one-time patterning process, and then the source electrode and the drain electrode are formed through another time of patterning process.

According to another array substrate provided by an embodiment of the present disclosure, a via hole structure penetrating through the organic film layer and the first passivation layer and exposing the connection structure is provided, and a connection structure capable of resisting oxidation and conducting electricity is disposed between the source electrode and the pixel electrode, and the connection structure is used to be connected with the source electrode on the one hand and connected to the pixel electrode through the via hole structure on the other hand, that is, the pixel electrode is connected to the source electrode through the connection structure and the via hole structure. In this way, even though performing etch process on the first passivation layer after finishing the mask process of the organic film layer will cause an undercut problem, the organic film layer is regressed by adding an ashing process to the organic film layer. Moreover, since the connection structure is resistant to oxidation and conductive, and the connection structure covers the source electrode, the connection structure can protect the metal in the source electrode from oxidation and corrosion, so that there will not be a corrosion layer. Furthermore, the connection structure is connected to the source electrode on the one hand and connected to the pixel electrode through the via hole structure on the other hand, which can ensure the effective connection between the pixel electrode and the source electrode and improve the product yield rate.

The array substrate provided by the present disclosure will be described in detail by taking a direct connection of the pixel electrode and the source electrode as an example.

Figure 4A:
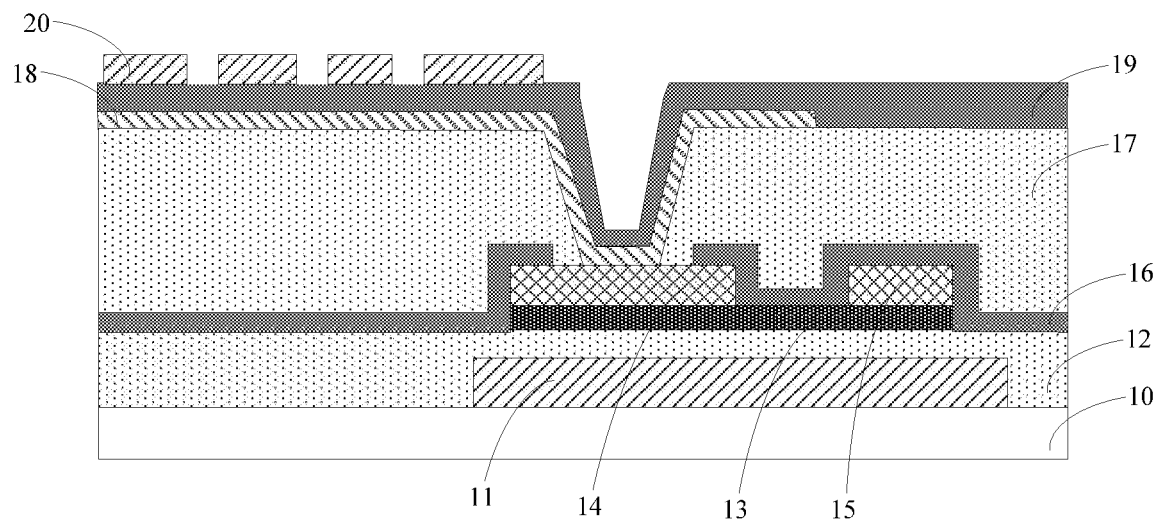
FIG. 4A is a schematic diagram of a structure of an array substrate in another exemplary embodiment of the present disclosure.

FIG. 4A is a schematic diagram of a structure of an array substrate in another exemplary embodiment of the present disclosure. As shown in FIG. 4A, another array substrate according to an embodiment of the present disclosure may include:

a base substrate 10;

a gate electrode 11 disposed on the base substrate 10;

a gate insulator layer 12 covering the gate electrode 11;

an active layer 13, a source electrode 14 and a drain electrode 15 disposed on the gate insulator layer 12, wherein a conductive channel is formed between the source electrode 14 and the drain electrode 15;

a first passivation layer 16 covering the source electrode 14, the drain electrode 15 and the conductive channel, wherein the first passivation layer 16 is provided with a first via hole exposing the source electrode 14;

an organic film layer 17 covering the first passivation layer 16, and the organic film layer 17 is provided with a second via hole; the second via hole communicates with the first via hole to form a via hole structure exposing the source electrode 14 (i.e., the via hole structure penetrates through the organic film layer 17 and the first passivation layer 16 and exposes the source electrode 14), and both sides of the organic film layer 17 near the source electrode 14 extend into the first via hole;

a pixel electrode 18 disposed on the organic film layer 17, and the pixel electrode 18 is recessed toward the base substrate at the position of the via hole structure to form a first groove;

the first groove formed by the pixel electrode 18 is disposed in the via hole structure, wherein the groove bottom of the first groove is connected to the source electrode 14, that is, the pixel electrode 18 is connected to the source electrode 14 through the via hole structure;

a second passivation layer 19 covering the pixel electrode 18 and the organic film layer 17, and the second passivation layer 19 is recessed toward the base substrate to form a second groove, wherein the second groove formed by the second passivation layer 19 is disposed in the first groove;

a common electrode layer 20 disposed on the second passivation layer 19.

In an exemplary embodiment, as shown in FIG. 4A, the gate electrode 11, the active layer 13, the source electrode 14, and the drain electrode 15 may form a thin film transistor.

In an exemplary embodiment, as shown in FIG. 4A, the pixel electrode 18 may be a plate electrode, and the common electrode 20 may be a slit electrode, which together with the pixel electrode 18 forms a multi-dimensional electric field to drive liquid crystal deflection.

In an exemplary embodiment, the connection structure may be made of chromium cobalt alloy, nickel-chromium alloy, tellurium-nickel-chromium alloy and other materials which are resistant to oxidation and conduct electricity.

Taking the array substrate as shown in FIG. 4A as an example, the technical solutions of the embodiments of the present disclosure will be described through the manufacturing process of the array substrate provided by the embodiments of the present disclosure.

As shown in FIGS. 4A to 4D, a method for manufacturing another array substrate according to an embodiment of the present disclosure may include:

S41: forming a gate electrode 11 on a base substrate 10;

S42: forming a gate insulator layer 12 covering the gate electrode 11, and forming an active layer 13, a source electrode 14 and a drain electrode 15 on the gate insulator layer 12, and a conductive channel is formed between the source electrode 14 and the drain electrode 15;

S43: forming a first passivation layer 16 covering the source electrode 14, the drain electrode 15 and the conductive channel, wherein the first passivation layer 16 is provided with a first via hole exposing the source electrode 14;

S44: forming an organic film layer 17 covering the first passivation layer 16, and the organic film layer 17 is provided with a second via hole; the second via hole communicates with the first via hole to form a via hole structure exposing the source electrode 14 (i.e., the via hole structure penetrates through the organic film layer 17 and the first passivation layer 16 and exposes the source electrode 14), and both sides of the organic film layer 17 close to the source electrode 14 extend into the first via hole;

S45: forming a pixel electrode 18 disposed on the organic film layer 17, and the pixel electrode 18 is recessed toward the base substrate at the position of the via hole structure to form a first groove; the first groove formed by the pixel electrode 18 is disposed in the via hole structure, wherein a groove bottom of the first groove is connected to the source electrode 14, that is, the pixel electrode 18 is connected to the source electrode 14 through the via hole structure;

S46: forming a second passivation layer 19 covering the pixel electrode 18 and the organic film layer 17, and the second passivation layer 19 is recessed toward the base substrate to form a second groove, wherein the second groove formed by the second passivation layer 19 is disposed in the first groove; and S47: forming a common electrode layer 20 disposed on the second passivation layer 19.

In an exemplary embodiment, Step S41 may include:

S411: depositing a first metal thin film on the base substrate.

S412: coating a layer of photoresist on the first metal thin film, performing step exposure and development on the photoresist by using a halftone or gray tone mask to form an unexposed region with a photoresist with a first thickness, at the position of the gate electrode and a fully exposed region without any photoresist at other positions.

S413: etching the fully exposed region through an etching process to remove the first metal thin film in the fully exposed region, and forming a gate electrode on the base substrate.

In an exemplary embodiment, the base substrate may be glass, plastic, or a flexible transparent plate.

In an exemplary embodiment, the first metal thin film may be made of metal materials such as aluminum, copper, molybdenum, titanium, niobium, silver, gold, tantalum, tungsten, chromium, etc., and may also be made conductive oxides such as indium tin oxide (ITO), indium zinc oxide (IZO), zinc oxide (ZnO), indium oxide (In2O3), aluminum-doped zinc oxide (AlZnO), etc., It may be of a single-layer structure or a multilayer composite structure.

In an exemplary embodiment, Step S42 may include:

S421: sequentially depositing a gate insulating thin film, a semiconductor thin film and a second metal thin film on the base substrate on which the gate electrode is formed.

S422: coating a layer of photoresist on the second metal thin film, performing step exposure and development on the photoresist by using a halftone or gray tone mask to form an unexposed regions with photoresist with the first thickness at the positions of the source and drain electrodes, a partially exposed region with photoresist with a second thickness at the conductive channel, and fully exposed regions with no photoresist at other positions. Here, the first thickness is greater than the second thickness.

S423: etching the fully exposed regions through a first etching process to remove the second metal thin film and the semiconductor thin film in the fully exposed regions.

S424: removing the photoresist in the partially exposed region through an ashing process to expose the second metal thin film.

S425: etching the second metal thin film in the partially exposed region by a second etching process to etch off the second metal thin film in the partially exposed region, stripping off the remaining photoresist to form the gate insulator layer, the active layer, the source electrode and the drain electrode on the base substrate, forming the conductive channel between the source electrode and the drain electrode, and keeping a semiconductor thin film below the source electrode and the drain electrode.

In an exemplary embodiment, the gate insulating thin film may be made of silicon nitride (SiNx), silicon oxide (SiOx), or silicon oxynitride (Si(ON)x). It may be a in a single layer structure, a double layer structure or a multilayer structure, and may be deposited by chemical vapor deposition (CVD) or plasma enhanced chemical vapor deposition (PECVD).

In an exemplary embodiment, the second metal film may be one or a mixture of metal materials such as aluminum, copper, molybdenum, niobium, titanium, silver, gold, tantalum, tungsten, chromium, etc., It may be of a single layer structure, a double-layer structure or multilayer structure, and may be deposited by a radio frequency magnetron sputtering method.

Figure 4B:
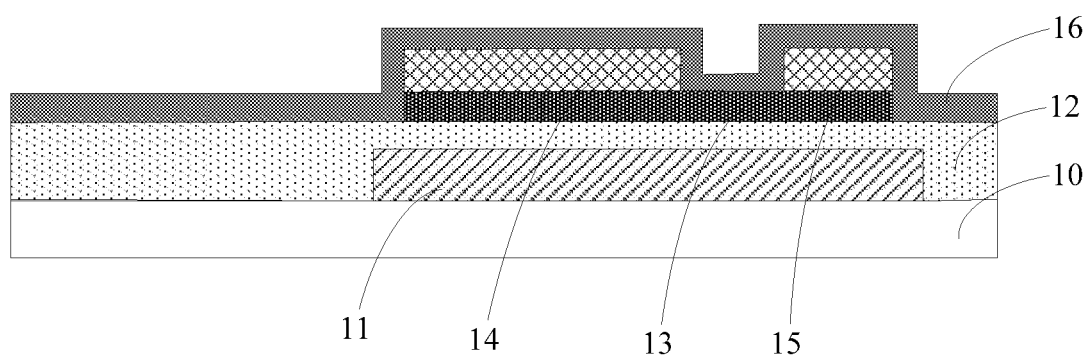
FIG. 4B is a schematic diagram after a first passivation layer is formed in another exemplary embodiment of the present disclosure.
Figure 4C:
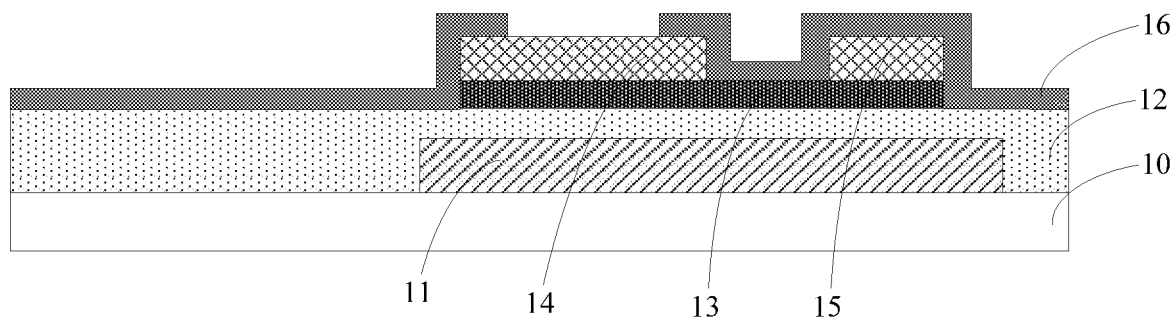
FIG. 4C is a schematic diagram after a first passivation layer is etched in another exemplary embodiment of the present disclosure.
Figure 4D:
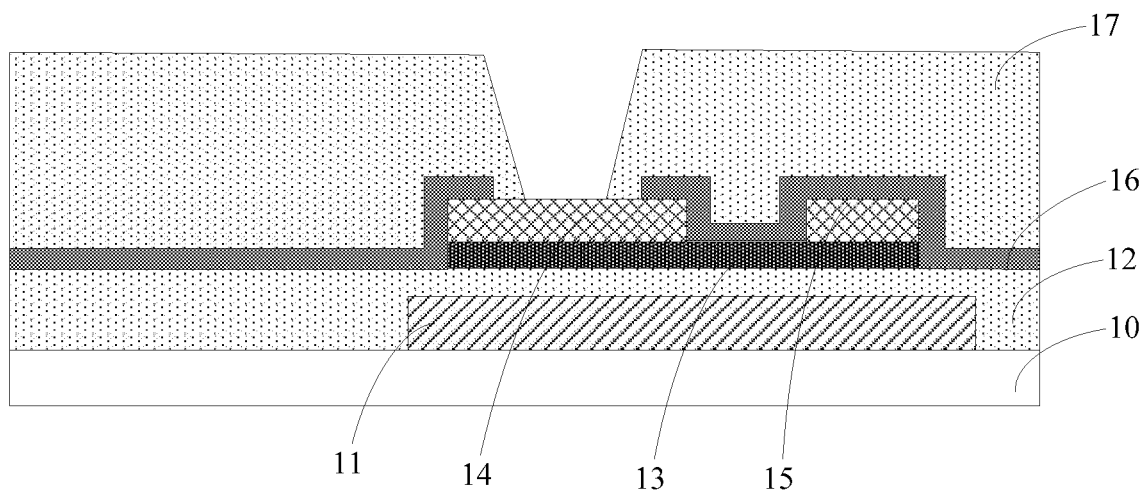
FIG. 4D is a schematic diagram after an organic film layer is formed in another exemplary embodiment of the present disclosure.

In an exemplary embodiment, as shown in FIGS. 4B to 4D, step S43 may include:
- S431: as shown in FIG. 4B, depositing a first passivation thin film on the source electrode 14, the drain electrode and the conductive channel.
- S432: coating a layer of photoresist on the first passivation thin film, exposing and developing the photoresist with a single tone mask to form an exposed region with no photoresist at the position of the first via hole and unexposed regions with photoresist kept at other positions.
- S433: etching the fully exposed region through an etching process to remove the first passivation thin film in the fully exposed region, as shown in FIG. 4C, and forming a first passivation layer 16 with the first via hole exposing the source electrode.

In an exemplary embodiment, the first passivation thin film may be one or a mixture of inorganic materials such as silicon nitride (SiNx), silicon oxide (SiOx), silicon oxynitride (Si(ON)x). It may be of a single layer structure, a double layer structure or a multilayer structure, and may be deposited by chemical vapor deposition (CVD) or plasma enhanced chemical vapor deposition (PECVD).

In an exemplary embodiment, Step S44 may include:
- S441: depositing an organic thin film on the first passivation layer;
- S442: coating a layer of photoresist on the organic thin film, exposing and developing the photoresist with a single tone mask to form a fully exposed region with no photoresist at the position of the second via hole and unexposed regions with the photoresist kept at other positions;
- S443: etching the fully exposed region through an etching process to remove the organic thin film in the region, and forming an organic film layer with the second via hole, wherein the second via hole communicates with the first via hole to form a via hole structure exposing the source electrode (i.e., the via hole structure penetrates through the organic film layer and the first passivation layer and exposes the source electrode), and both sides of the organic film layer close to the source electrode extend into the first via hole.

In an exemplary embodiment, organic materials such as polyimide and naphthoquinonediazide compound may be used for the organic thin film.

In an exemplary embodiment, Step S45 may include:
- S451: depositing a first transparent conductive thin film on the organic film layer;
- S452: coating a layer of photoresist on the first transparent conductive thin film, exposing and developing the photoresist with a single tone mask to form an exposed region with no photoresist at the position of the pixel electrode and unexposed regions with photoresist kept at other positions; and
- S453, etching the exposed region through an etching process to remove the first transparent conductive thin film in the region to form the pixel electrode; the pixel electrode is recessed toward the base substrate at the position of the via hole structure to form a first groove; the first groove formed by the pixel electrode is disposed in the via hole structure, wherein a groove bottom of the first groove is connected to the source electrode, that is, the pixel electrode is connected to the source electrode through the via hole structure.

In an exemplary embodiment, the first transparent conductive thin film may be made of indium tin oxide (ITO) or indium zinc oxide (IZO), and may be deposited by a radio frequency magnetron sputter method.

In an exemplary embodiment, Step S46 may include:
- S461: depositing a second passivation thin film on the pixel electrode and the organic film layer, and forming a second passivation layer covering the pixel electrode and the organic film layer, and the second passivation layer is recessed toward the base substrate to form a second groove, wherein the second groove formed by the second passivation layer is disposed in the first groove.

In an exemplary embodiment, the second passivation thin film may be one or a mixture of inorganic materials such as silicon nitride (SiNx), silicon oxide (SiOx), silicon oxynitride (Si(ON)x). It may be of a single layer structure, a double layer structure or a multilayer structure, and may be deposited by chemical vapor deposition (CVD) or plasma enhanced chemical vapor deposition (PECVD).

In an exemplary embodiment, Step S47 may include:
- S471: depositing a second transparent conductive thin film on the second passivation layer;
- S472: coating a layer of photoresist on the second transparent conductive thin film, exposing and developing the photoresist with a single tone mask to form a unexposed region with photoresist kept at the position of the common electrode and fully exposed regions with no photoresist at other positions; and
- S473: etching the exposed region through an etching process to remove the second transparent conductive thin film in the region to form a common electrode; wherein the common electrode is a slit electrode.

In an exemplary embodiment, the second transparent conductive thin film may be made of indium tin oxide (ITO) or indium zinc oxide (IZO), and may be deposited by a radio frequency magnetron sputter method.

Of course, in actual implementation, another array substrate provided in the embodiment of the present disclosure may also be manufactured by other methods. For example, the gate electrode, the gate insulator layer, the active layer, the source electrode and the drain electrode may be completed through a two-time patterning process, in which the gate electrode is formed through a one-time patterning process, and then the gate insulator layer, the active layer, the source electrode and the drain electrode are formed through another time of patterning process. For another example, the gate insulator layer, the active layer, the source electrode and the drain electrode may also be completed through a two-time patterning process, in which the gate insulator layer and the active layer are formed through a one-time patterning process, and then the source electrode and the drain electrode are formed through another time of patterning process.

According to another array substrate provided by the embodiment of the present disclosure, in a process of manufacturing the array substrate, an etching process of first passivation layer is performed before a mask process of organic film layer is performed, so that an undercut problem will not occur. Thus, it is unnecessary to add a photoresist ashing process to the organic film layer to regress the organic film layer, which further prevents the problem of oxidation corrosion of some metals in the source electrode. In this way, on the one hand, by penetrating through the organic film layer and the first passivation layer and exposing the via hole structure of the source electrode, the effective connection between the pixel electrode and the source electrode can be achieved, and the product yield rate can be improved. On the other hand, compared with the current manufacturing method of the array substrate, in the manufacturing process of the array substrate provided by the embodiment of the present disclosure, an ashing process can be saved, so as to reduce the production cost and improve the production efficiency.

Based on the foregoing embodiments, taking the taking the example where the connection structure connecting the source electrode and the pixel electrode of the thin film transistor is arranged in the via hole structure exposing the pixel electrode and the source electrode, an embodiment of the present disclosure further provides a method for manufacturing an array substrate, which may include:

S51: forming a base substrate, and forming a thin film transistor on the base substrate;

S52: forming a first passivation layer, an organic film layer and a pixel electrode disposed on the thin film transistor, forming a via hole structure exposing the pixel electrode and the source electrode of the thin film transistor, and forming a connection structure for connecting the source electrode and the pixel electrode in the via hole structure exposing the pixel electrode and the source electrode of the thin film transistor;

In an exemplary embodiment, Step S52 may include:

S521: forming a first passivation layer covering the thin film transistor;

S522: forming an organic film layer covering the first passivation layer, wherein the organic film layer is provided with a second via hole;

S523: forming a pixel electrode disposed on the organic film layer, wherein the pixel electrode is provided with a third via hole which is communicated with the second via hole;

S524: forming a second passivation layer disposed on the pixel electrode;

S525: forming a fourth via hole exposing the pixel electrode on the second passivation layer and a first via hole exposing the source electrode on the first passivation layer by one etching process, wherein the fourth via hole is communicated with the first via hole and the first via hole is communicated with the second via hole, and the first via hole, the second via hole, the third via hole and the fourth via hole form the via hole structure exposing the pixel electrode and the source electrode of the thin film transistor; and S526: forming a connection structure for connecting the source electrode and the pixel electrode in the via hole structure exposing the pixel electrode and the source electrode of the thin film transistor.

In an exemplary embodiment, Step S525 may include:

S5251: forming the common electrode on the second passivation layer through a one-time patterning process, and forming the connection structure for connecting the source electrode and the pixel electrode in the via hole structure exposing the pixel electrode and the source electrode of the thin film transistor.

Based on the foregoing embodiments, taking the example where the connection structure for connecting the source electrode and the pixel electrode of the thin film transistor is arranged between the pixel electrode and the source electrode, an embodiment of the present disclosure further provides a method for manufacturing an array substrate, which may include:

S61: forming a base substrate, and forming a thin film transistor on the base substrate;

S62: forming a first passivation layer, an organic film layer and a pixel electrode on the thin film transistor, and forming a connection structure for connecting the source electrode and the pixel electrode between the pixel electrode and the source electrode;

In an exemplary embodiment, Step S62 may include:

S621: forming the connection structure covering the source electrode and the drain electrode of the thin film transistor;

S622: forming the first passivation layer covering the connection structure, and forming the organic film layer covering the first passivation layer, wherein the organic film layer is provided with a second via hole; the first passivation layer is provided with a first via hole communicating with the second via hole and exposing the connection structure, the second via hole and the first via hole form the via hole structure exposing the connection structure, and the connection structure is connected to the source electrode;

S623: forming the pixel electrode disposed on the organic film layer, and the pixel electrode is connected to the connection structure through the via hole structure; and S624: forming a second passivation layer covering the pixel electrode.

In an exemplary embodiment, Step S622 may include:

S6221: depositing a first passivation thin film on the connection structure;

S6222: coating a layer of photoresist on the first passivation thin film, exposing and developing the photoresist by using a mask, forming an exposed region at the position of the connection structure and forming unexposed regions at other positions;

S6223: depositing an organic thin film on the first passivation thin film coated with photoresist;

S6224: coating a layer of photoresist on the organic thin film, exposing and developing the photoresist by using a mask, forming a partially exposed region and a fully exposed region at position of the second via hole, and forming unexposed regions at other positions;

S6225: etching off the fully exposed region of the organic film layer through an etching process;

S6226: etching the fully exposed region of the first passivation thin film through an etching process to form the first passivation layer with the first via hole; and S6227: removing photoresist in part of the exposed region of the organic thin film through an ashing process to form the organic film layer with the second via hole.

Based on the foregoing embodiments, taking the direct connection of the pixel electrode and the source electrode as an example, an embodiment of the present disclosure further provides a method for manufacturing an array substrate, which may include:

S71: forming a base substrate, and forming a thin film transistor on the base substrate;

S72: forming a first passivation layer, an organic film layer and a pixel electrode disposed on the thin film transistor, and forming a via hole structure exposing the source electrode, wherein the pixel electrode is connected to the source electrode through the via hole structure exposing the source electrode.

In an exemplary embodiment, Step S72 may include:

S721: forming the first passivation layer covering the thin film transistor, and the first passivation layer is provided with a first via hole exposing the source electrode;

S722: forming an organic film layer covering the first passivation layer, wherein the organic film layer is provided with a second via hole, and the second via hole is communicated with the first via hole to form a via hole structure exposing the source electrode;

S723: forming a pixel electrode disposed on the organic film layer, wherein the pixel electrode is connected to the source electrode through the via hole structure exposing the source electrode; and S724: forming a second passivation layer covering the pixel electrode and the organic film layer.

An embodiment of the present disclosure further provides a display apparatus which includes the array substrate of above embodiments. The display apparatus may be any product or component with a display function, such as a mobile phone, a tablet computer, a television, a display, a laptop computer, a digital photo frame, a navigator, etc.

In the description of the present disclosure, it should be understood that an orientation or position relationship indicated by the terms "middle", "upper", "lower", "front", "rear", "vertical", "horizontal", "top", "bottom", "inner", "outer" and the like is based on the orientation or position relationship shown in the accompanying drawings, which is only for the convenience of describing the present disclosure and simplifying the description, rather than indicating or implying that the apparatus or element referred to must have the specific orientation, or be constructed and operated in the specific orientation, and thus cannot be interpreted as a limitation on the present disclosure.

The drawings in the present disclosure only refer to the structures involved in the present disclosure, and common designs may be referred to for other structures. The embodiments of the present disclosure, i.e., features in the embodiments may be combined with each other to obtain new embodiments if there is conflict.

Those of ordinary skills in the art should understand that modifications or equivalent substitutions may be made to the technical solutions of the present disclosure without departing from the spirit and scope of the technical solutions of the present disclosure, all of which should be included within the scope of the claims of the present disclosure.

What is claimed is:

1. An array substrate comprising:
a base substrate;
a thin film transistor disposed on the base substrate;
a first passivation layer, an organic film layer and a pixel electrode disposed on the thin film transistor;
a connection structure configured to connect a source electrode of the thin film transistor and the pixel electrode, wherein the connection structure is disposed in a via hole structure exposing the pixel electrode and the source electrode; and
a second passivation layer disposed on a side of the pixel electrode away from the base substrate;
wherein the connection structure is disposed in the via hole structure exposing the pixel electrode and the source electrode, and comprises: a first via hole exposing the source electrode formed on the first passivation layer, a second via hole communicated with the first via hole formed on the organic film layer, a third via hole communicated with the second via hole formed on the pixel electrode, a fourth via hole which communicates with the third via hole and exposes the pixel electrode formed on the second passivation layer, wherein the fourth via hole, the third via hole, the second via hole and the first via hole form the via hole structure exposing the pixel electrode and the source electrode, and the connection structure is connected to the pixel electrode through the via hole structure and is connected to the source electrode.

2. The array substrate according to claim 1, further comprising: the second passivation layer disposed on a side of the pixel electrode away from the base substrate and a common electrode disposed on a side of the second passivation layer away from the base substrate; wherein the connection structure and the common electrode are disposed on a same layer and made of a same material.

3. The array substrate according to claim 2, wherein a material of the connection structure comprises indium tin oxide or indium zinc oxide.

4. The array substrate according to claim 1, wherein a material of the connection structure is an oxidation-resistant and conductive material.

5. The array substrate according to claim 4, wherein the oxidation-resistant and conductive material comprises any one of chromium-cobalt alloy, nickel-chromium alloy and tellurium-nickel-chromium alloy.

6. The array substrate according to claim 1, wherein the thin film transistor comprises a gate electrode, an active layer, the source electrode and a drain electrode, the gate electrode is disposed on the base substrate and covered by a gate insulator layer; the active layer, the source electrode and the drain electrode are disposed on the gate insulator layer, and a conductive channel is formed between the source electrode and the drain electrode.

7. A display apparatus, comprising the array substrate according to claim 1.

8. A method for manufacturing an array substrate, comprising:
forming a base substrate, and forming a thin film transistor on the base substrate;
forming a first passivation layer, an organic film layer and a pixel electrode disposed on the thin film transistor, forming a via hole structure exposing the pixel electrode and the source electrode of the thin film transistor, and forming a connection structure configured to connect the source electrode and the pixel electrode in the via hole structure exposing the pixel electrode and the source electrode of the thin film transistor;
wherein forming the first passivation layer, the organic film layer and the pixel electrode disposed on the thin film transistor, forming the via hole structure exposing the pixel electrode and the source electrode of the thin film transistor, and forming the connection structure configured to connect the source electrode and the pixel electrode in the via hole structure exposing the pixel electrode and the source electrode of the thin film transistor comprises:
forming the first passivation layer covering the thin film transistor;
forming the organic film layer covering the first passivation layer, wherein the organic film layer is provided with a second via hole;
forming the pixel electrode disposed on the organic film layer, wherein the pixel electrode is provided with a third via hole which is communicated with the second via hole;
forming a second passivation layer disposed on the pixel electrode;
forming a fourth via hole exposing the pixel electrode on the second passivation layer and a first via hole exposing the source electrode on the first passivation layer through a one-time etching process, wherein the fourth via hole is communicated with the first via hole and the first via hole is communicated with the second via hole, and the first via hole, the second via hole, the third via hole and the fourth via hole form the via hole structure exposing the pixel electrode and the source electrode of the thin film transistor; and forming the connection structure configured to connect the source electrode and the pixel electrode in the via hole structure exposing the pixel electrode and the source electrode of the thin film transistor.

9. The method according to claim 8, wherein forming the connection structure configured to connect the source electrode and the pixel electrode in the via hole structure exposing the pixel electrode and the source electrode of the thin film transistor comprises:

forming a common electrode on the second passivation layer through a one-time patterning process, and forming the connection structure configured to connect the source electrode and the pixel electrode in the via hole structure exposing the pixel electrode and the source electrode of the thin film transistor.

* * * * *